(12) United States Patent
Heuken

(10) Patent No.: US 6,964,876 B2
(45) Date of Patent: Nov. 15, 2005

(54) METHOD AND DEVICE FOR DEPOSITING LAYERS

(75) Inventor: Michael Heuken, Aachen (DE)

(73) Assignee: Aixtron AG, (DE)

( * ) Notice: Subject to any disclaimer, the term of this patent is extended or adjusted under 35 U.S.C. 154(b) by 0 days.

(21) Appl. No.: 10/715,282

(22) Filed: Nov. 17, 2003

(65) Prior Publication Data

US 2004/0152219 A1   Aug. 5, 2004

Related U.S. Application Data

(63) Continuation of application No. PCT/EP02/04407, filed on Apr. 22, 2002.

(30) Foreign Application Priority Data

May 17, 2001 (DE) ................................ 101 24 609

(51) Int. Cl.$^7$ ........................ H01L 21/20; H01L 21/66
(52) U.S. Cl. ...................................... 438/16; 438/483
(58) Field of Search ....................... 438/5–18, 479–503

(56) References Cited

U.S. PATENT DOCUMENTS

| | | | |
|---|---|---|---|
| 4,976,217 A | 12/1990 | Frijlink | 118/733 |
| 4,991,540 A | 2/1991 | Jürgensen et al. | 118/715 |
| 5,091,320 A * | 2/1992 | Aspnes et al. | 427/8 |
| 5,162,256 A | 11/1992 | Jürgensen | 437/110 |
| 5,348,911 A | 9/1994 | Jürgensen et al. | 117/91 |
| 5,438,952 A * | 8/1995 | Otsuka | 117/84 |
| 5,441,703 A | 8/1995 | Jürgensen | 422/129 |
| 5,453,124 A | 9/1995 | Moslehi et al. | 118/715 |
| 5,467,732 A * | 11/1995 | Donnelly et al. | 438/7 |
| 5,595,606 A | 1/1997 | Fujikawa et al. | 118/725 |
| 5,709,757 A | 1/1998 | Hatano et al. | 134/22.14 |
| 5,772,759 A | 6/1998 | Heime et al. | 117/103 |
| 6,086,677 A | 7/2000 | Umotoy et al. | 118/715 |
| 6,210,745 B1 * | 4/2001 | Gaughan et al. | 427/8 |
| 6,217,651 B1 | 4/2001 | Kashino et al. | 117/85 |
| 6,306,668 B1 * | 10/2001 | McKee et al. | 438/7 |
| 6,410,347 B1 * | 6/2002 | Baek et al. | 438/7 |
| 2002/0102749 A1 * | 8/2002 | Fielden et al. | 438/14 |

FOREIGN PATENT DOCUMENTS

DE            35 37 544 C1       5/1987

(Continued)

OTHER PUBLICATIONS

Characterization of Epitaxal Semiconductor Growth, J.T. Zettler, Progression of Crystal Growth and Characterization, vol. 35, pp. 27-98, 1997.

Primary Examiner—Savitri Mulpuri
(74) Attorney, Agent, or Firm—St. Onge Steward Johnston & Reens LLC

(57) ABSTRACT

The invention relates to a device comprising a process chamber which is arranged in a reaction housing and which can be heated especially by supplying heat to a substrate holder, comprising a gas inlet for the admission of gaseous starting material, whereby the decomposition products thereof are deposited on a substrate maintained by a substrate holder to form a layer, also comprising at least one sensor acting upon the inside of the process chamber for determining layer properties further comprising an electronic control unit for controlling the heating of the process chamber, mass controllers for controlling the flow of the starting materials and a pump for controlling the pressure of the process chamber, characterized in that the electronic control unit forms modified process parameters from deviation values obtained upon growth of the calibrating layer with the aid of stored calibrating parameters, thereby controlling the heating of the process chamber, the flow controllers and the pump upon growth of the active layer sequence.

13 Claims, 3 Drawing Sheets

FOREIGN PATENT DOCUMENTS

| | | |
|---|---|---|
| DE | 36 08 783 C2 | 9/1987 |
| DE | 41 33 479 A1 | 9/1993 |
| DE | 42 32 504 A1 | 3/1994 |
| DE | 43 26 696 A1 | 2/1995 |
| DE | 43 26 697 A1 | 3/1995 |
| DE | 44 46 992 A1 | 7/1995 |
| DE | 195 22 574 A1 | 1/1996 |
| DE | 195 40 771 A1 | 7/1997 |
| DE | 198 13 523 A1 | 10/1999 |
| EP | 0 243 416 B1 | 4/1987 |
| EP | 0 233 610 B1 | 8/1987 |
| EP | 0 324 812 B1 | 7/1989 |
| EP | 0 428 673 B1 | 5/1991 |
| EP | 0 545 238 B1 | 6/1993 |
| WO | WO 87/05700 | 9/1987 |
| WO | WO 91/20093 | 12/1991 |
| WO | WO 99/15710 | 4/1999 |

* cited by examiner

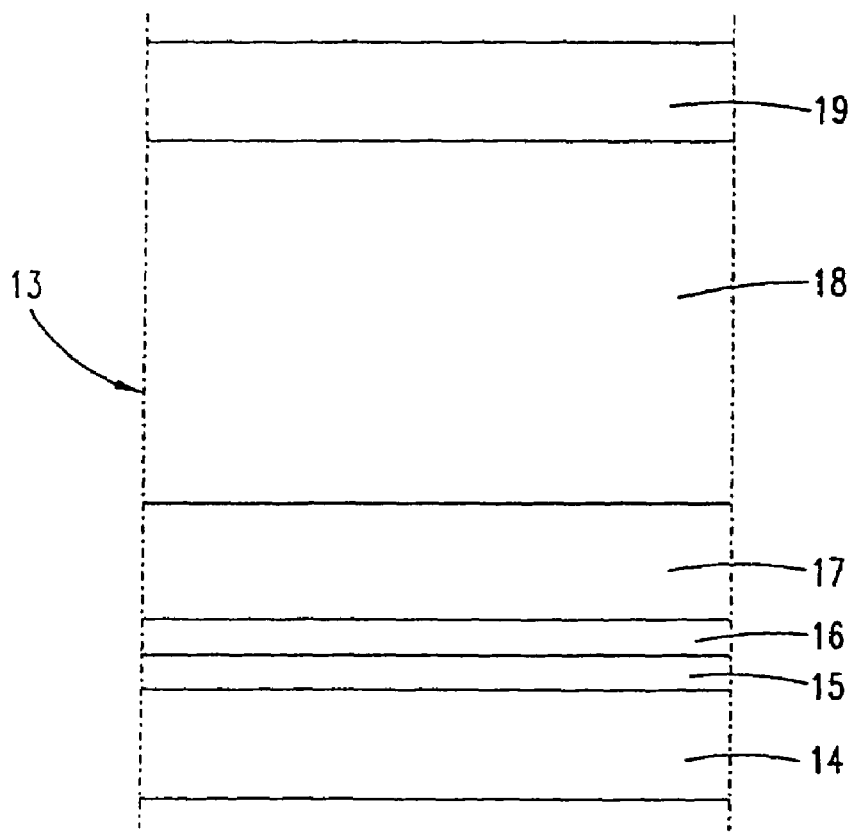

METHOD AND DEVICE FOR DEPOSITING LAYERS

This application is a continuation of pending International Patent Application No. PCT/EP02/04407 filed Apr. 22, 2002 which designates the United States and claims priority of pending German Application No. 10124609.9 filed May 17, 2001.

The invention relates to a method and a device for depositing in particular crystalline active layers on in particular crystalline substrates from gaseous starting substances, which are introduced, in particular together with a carrier gas, into the process chamber of a reactor, where, depending on process parameters determined in preliminary tests, such as in particular substrate temperature, process chamber pressure, mass flow of the starting substances introduced into the process chamber or total mass flow, in particular after prior pyrolytic decomposition, they are deposited on the substrate and form an active layer, the layer properties of which, such as in particular stoichiometry, doping, morphology, temperature, growth rate or the like, are determined from surface measurements or measured without contact by means of sensors acting in the process chamber.

Methods of this type are carried out in a device which has a reactor housing in which there is a process chamber which can be heated in particular by heat being supplied to a substrate holder, having a gas inlet for the admission of gaseous starting substances, the decomposition products of which are deposited on a substrate supported by the substrate holder to form a layer, having at least one sensor which acts into the process chamber in order to determine the layer properties during the layer growth, and having an electronic control unit for controlling the process chamber heating, mass flow controllers for controlling the mass flow of the starting substances and a pump for controlling the process chamber pressure.

Devices of the generic type on which the method of the generic type is carried out are known in the prior art, in particular in the form of metalorganic vapor phase epitaxy installations. Devices of this type are described, for example, by DE 35 37 544 C1, EP 0 243 416 B1, U.S. Pat. Nos. 5,441,703, 4,991,540, EP 0 324 812 B1, U.S. Pat. No. 5,348,911, EP 0 428 673 B1, U.S. Pat. No. 5,162,256, DE 36 08 783 C2, DE 41 33 497 A1, DE 42 32 504 A1, U.S. Pat. No. 5,772,759, DE 43 26 697 A1, DE 43 26 696 A1, DE 44 46 992 A1, DE 195 22 574 A1, DE 195 40 771 A1, DE 198 13 523 A1.

However, the device and method are also known from U.S. Pat. Nos. 5,595,606, 5,709,757, 5,453,124, 6,086,677 or from 4,976,217.

Metalorganic vapor phase epitaxy is nowadays an industrial method which is in widespread use for the fabrication of electronic and optoelectronic components from III/V compound semiconductors. Differently doped layers of different compositions are deposited simultaneously with a high degree of uniformity on a plurality of substrates. In the process, the important growth parameters, such as temperature, composition of the vapor phase and total pressure, are controlled. The values to be set for the particular component are determined in series of preliminary tests and are then put together accordingly for a component. A drift in the required settings over the course of time, for example caused by ageing of the measuring equipment, an altered state of the deposition chamber caused by deposition or slight changes to the ambient conditions are not taken into account. This often leads to layer properties which are not reproducible and do not comply with specifications. Since some components (VCSEL, vertical cavity surface emitting laser; HEMT, high electron mobility transistors; LED light emitting diodes; edge emitting laser; HBT, hetero bipolar transistors, detectors, solar cells) require the layer thickness to be monitored to a level of one atomic layer and also require monitoring of the composition and doping to less than one percent, the proportion of defective processes which employ this method without monitoring and feedback is rising. This leads to increased production costs. Nowadays, measurement methods which measure the most important layer properties during the layer growth are available in order to improve this situation. RAS (reflection anisotropy spectroscopy) can be used to determine the growth rate, the doping, the layer composition and interfacial properties during the growth in a multiple substrate epitaxy reactor. Ellipsometry, reflection measurements or X-ray measurements in the reactor can give similar data which can be used to improve the active zone in a component. A simple control circuit for subsequent in situ determination of the layer properties is insufficient, since the layer which has already been produced with the non-optimum properties would already dominate the component.

To monitor layer properties and wafer temperature in a reactor, it is known to measure indirect properties on calibration wafers during and after the process. The results and conclusions from test runs are then transferred to the actual production run. The invention is based on the object of improving the monitoring and control of methods of the generic type for the production of complex structures from compound semiconductors for electronic and optoelectronic components.

The object is achieved by the invention given in the claims.

According to the invention, the method is developed in particular by virtue of the fact that, in addition to the set of process parameters which contains the process parameters which lead to the desired layer properties, calibration parameters are also determined in the preliminary tests, by the deviations in the layer properties when individual process parameters are varied being determined and the corresponding deviation being placed into a relationship with the process parameter variation, and by, in the production run, prior to the deposition of the active layer, at least one calibration layer, the layer properties of which are measured or determined, being deposited in the same production run, deviation values being formed by placing these properties in a relationship to the desired layer properties, and by one or more process parameters being altered in accordance with the calibration parameters for deposition of the active layer as a function of the magnitude of the deviation values. The known device is developed by virtue of the fact that the electronic control uses stored calibration parameters to form altered process parameters from deviation values obtained during growth of the calibration layer, and thereby controls the process chamber heating, the mass flow controllers and the pump during the growth of the active layer sequence. In a first step, in which the optimum set of process parameters is determined by means of preliminary tests, calibration parameters are determined in addition to these process parameters. These calibration parameters provide information as to the direction in which the layer properties change when a process parameter is altered slightly. The calibration parameters can be used, for example, to ascertain how the stoichiometry, the doping, the morphology, the temperature and the growth rate of the layer which is instantaneously being deposited in the process chamber changes if, for example, the temperature, the total mass flow or the mass flow of a gaseous starting substance is altered. In this respect, the preliminary tests include secondary tests in which in each case preferably one but possibly even a plurality of parameters are changed simultaneously. By in situ measurement inside the process chamber, the layer properties of the layer which is instantaneously growing are measured. Volumetric properties, such as for example composition close to the surface, composition of the layer deeper down or the growth rate, can also be determined from the surface measurements. These layer properties are placed into a relationship with respect to the layer properties which are measured or determined using the optimum parameter set. Deviation values are formed therefrom. It is then possible to calculate, from the deviation values and from the known process parameter variations, calibration parameters which indicate the direction in which countermeasures are to be taken by varying the process parameters when the layer properties with a set desired parameter set deviate from the desired values, which, as has been stated above, may occur as a result of drift or ageing or the like. According to the invention, one or more calibration layers are deposited on the substrate, in particular after prior deposition of a buffer layer. The calibration layers are deposited using the desired parameter set determined in preliminary tests or using a set of process parameters from which knowledge of previous production runs indicates that it is possible to obtain the desired layer properties. During the growth of the calibration layer, the layer properties are measured or determined in the same way as in the preliminary tests and in the growth of the active layer. If a deviation from the desired layer properties results, taking account of the previously determined calibration parameters, countermeasures are taken in such a manner that the process parameters are altered in accordance with the calibration parameters as a function of the magnitude of the deviation values. These altered process parameters are used to carry out the deposition of the active layer. The altered process parameters are preferably determined using the electronic control unit of the device. It is possible to deposit one or more calibration layers. The number of calibration layers to be deposited is dependent on the complexity of the active layer, which may consist of a multiplicity of individual layers. The measurement is preferably carried out without contact and therefore does not influence the process sequence. The method is preferably an MOCVD method. In this method, the metalorganic components of group III are preferably present in liquid form and are held at a defined temperature in baths. These source temperatures may also be encompassed by the process monitoring. In this case, calibration parameters are determined for them too. The mass flows of the starting substances, to which carrier gases may also be admixed, are measured and controlled using mass flow controllers. The starting substances may also comprise one or more dopants. The mass flow of the dopants, like the bath temperature of the dopant source, may also form a process parameter which is included in the process monitoring. In this case, the dopant concentrations inside the process chamber are also determined optically or in some other way during the process as a further layer property. Furthermore, it is possible to determine the stress in the layer as a layer property, in order to keep it within desired limits by suitably altering the process parameters. The sensor may be a reflection anisotropy spectroscopy (RAS). However, it is also possible for the layer properties to be determined by means of ellipsometry or using other methods, e.g. by thermocouple measurements. X-ray diffraction can also be employed for the determination of layer properties. The data determined in situ can be correlated with other data determined at different locations in the reactor. The calibration parameters and/or deviation values are determined without the active layer being adversely affected. If the deviation values are large enough, the active layer is deposited using altered parameters. The variation in the parameters for determination of the calibration parameters by placing the deviations in the layer properties into a relationship with respect to the desired layer properties is only very slight, and consequently the altered process parameters during deposition of the active layer can be implemented from a linear relationship between the deviation values and the calibration parameters. A thermocouple can be used to measure the temperature of the substrate holder. The layers in the calibration layer sequence may have different energy gaps. The calibration layers may also have different growth rates.

The invention also relates to a semiconductor layer sequence which comprises one or more calibration layers and which, after a buffer layer, is followed by the active layer.

BRIEF DESCRIPTION OF THE DRAWINGS

The invention is explained in more detail below on the basis of exemplary embodiments. In the drawing:

FIG. 3 shows the structure of a semiconductor layer.

DETAILED DESCRIPTION OF THE DRAWINGS

Figure 1:
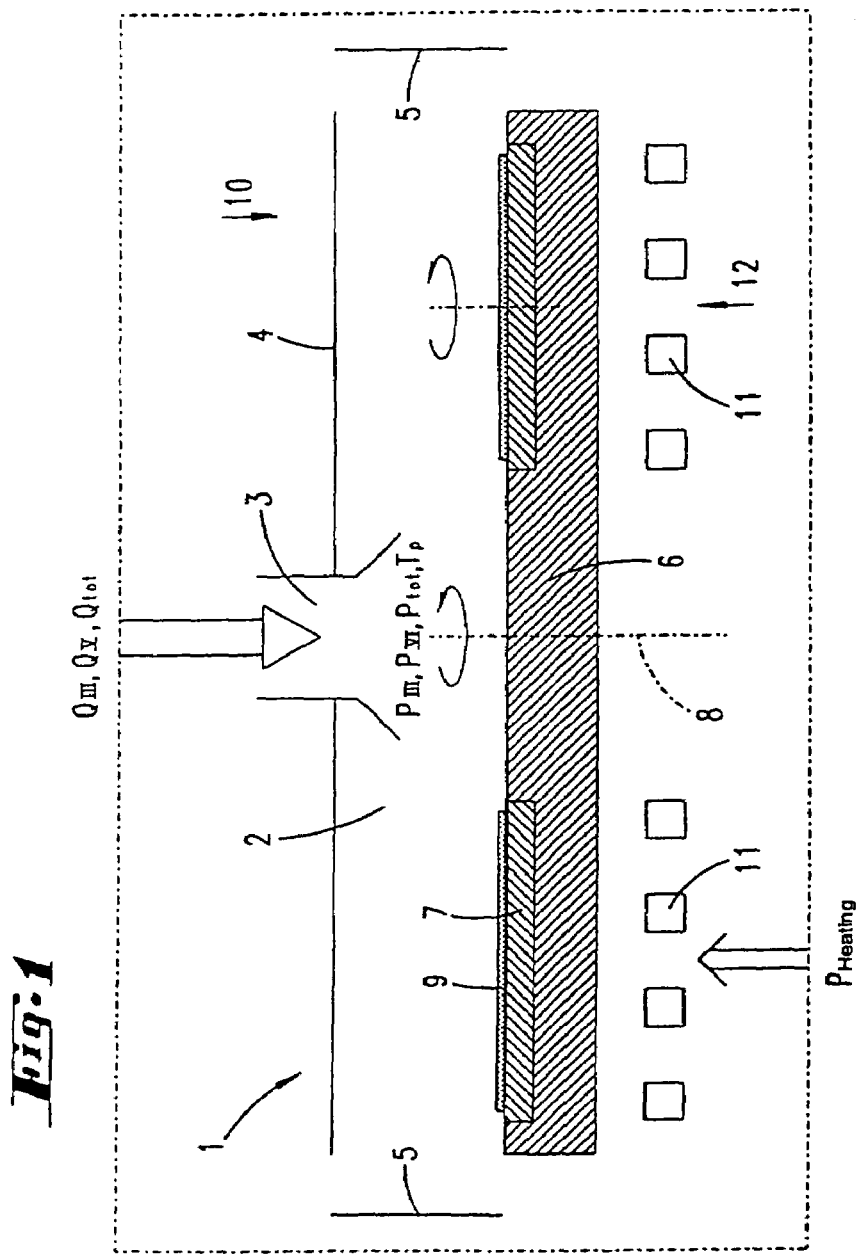
FIG. 1 shows the diagrammatic structure of an MOCVD epitaxy device.

The reactor 1, which is illustrated highly diagrammatically in FIG. 1, has a process chamber 2. The starting substances, for example trimethylgallium, trimethylindium, arsine, phosphine, hydrogen or nitrogen, enter the process chamber 2 through the gas inlet 3. The incoming flow of the gases into the process chamber 2 through the gas inlet 3 is effected by controlling the global parameter mass flow. In addition, the vapor pressure of the liquid or solid MO sources is controlled.

In the process chamber 2 there is a substrate holder carrier 6 which is heated from below by means of a heater 11. On the substrate holder carrier, which is rotated about the axis of rotation 8 during the production run, there are one or more substrate holders 7, which are likewise driven in rotation about their own axes. The substrates 9, which may be gallium arsenide or indium phosphide or gallium nitride single-crystal wafers, are located on the substrate holders 7. Other suitable substrate materials include wafers made from magnesium oxide, sapphire, silicon or silicon carbide. The process chamber cover 4 is located above the substrate holder carrier 7. The process chamber 2 is surrounded by the process chamber walls 5. The process chamber cover 4 and the process chamber wall 5 may themselves be heated. However, they may also be cooled. At any rate, they are generally exposed to radiation heating from the substrate holder carrier 6.

The total pressure inside the process chamber 2 is controlled by means of a pump (not shown) which pumps the gas out of the process chamber.

The temperature of the substrate holder carrier 6 can be measured by means of a thermocouple or pyrometrically 12. In addition, there are sensors which are denoted by reference numeral 10 and by means of which the layer properties are measured by ellipsometry or spectroscopy. In particular, during the layer growth the sensors measure the surface reconstruction, the surface stoichiometry, the doping close to the surface, the surface morphology, the surface temperature and the composition close to the surface. The growth rate or the composition deeper in the layer can be determined from these measured values.

These layer properties are placed into a relationship with the process parameters, which also include the rotational speed of the substrate holder carrier and of the substrate holders. The optimum process parameters are determined in preliminary tests. Once these parameters have been found, supplementary preliminary tests are carried out, in which individual process parameters are altered slightly. These alterations lead to changes in the layer properties. The deviations in the layer properties are placed into a relationship with the corresponding deviation in the process parameter, in such a manner that it is possible to form calibration parameters. This is done by calculation. The calibration parameters indicate the way in which the process parameters are to be changed if it is desired to change one or more layer properties. This is necessary whenever it is impossible to deposit a layer having the desired layer properties using the process parameters determined in the preliminary tests, but rather one or more layer properties have changed, as a result of drift, ageing or the like. Then, new process parameters, which are used to deposit the active layer, are formed using the calibration parameters and the determined magnitude of the deviation values for the layer properties.

To determine the magnitude of the calibration parameters, before the active layer is deposited, one or more calibration layers are deposited on the substrate or on a buffer layer which has been applied to the substrate.

The composition or sequence of the calibration layers is dependent on the type of active layer or on the type of active layer system. By way of example, it is advantageous to deposit a calibration layer sequence with a different energy gap if the active layer is to have potential well structures. The composition, the growth rate and the nature of the interface during growth are also determined during this deposition of the calibration layers.

If a VCSEL structure is to be deposited, the calibration layer sequence comprises layers for determining the composition, the corresponding growth rate and the minimum doping which is in each case required.

To produce laser structures, the calibration layer sequence preferably comprises layers in which it is possible to determine not just the doping but also the stress of the structure.

When producing pseudomorphous heterostructure field-effect transistors, the properties of the active interface with respect to the conductive channel, the stress state of the channel and the minimum doping which is in each case required are determined during deposition of the calibration layer sequence.

A plurality of calibration layers are also deposited when producing heterostructure bipolar transistors.

The method is also suitable for the production of relatively small-dimensioned structures, for example quantum dots or quantum wires, which consist only of non-cohesive lateral accumulations of atoms.

The method can also be used to calibrate, pyrometrically or in some other optical way, the temperature measurement inside the reactor by means of thermocouples. In this case, the calibration layer sequence comprises layers of a defined composition, different growth rates and interfaces.

The method is also suitable for advantageously utilizing substrates with different surface properties, including, for example, the advantageous desorption of the oxide layer prior to the start of growth or the monitoring of the influence of surfactants.

The method is suitable for producing binary, ternary or quaternary layers with changing compositions.

Figure 2:
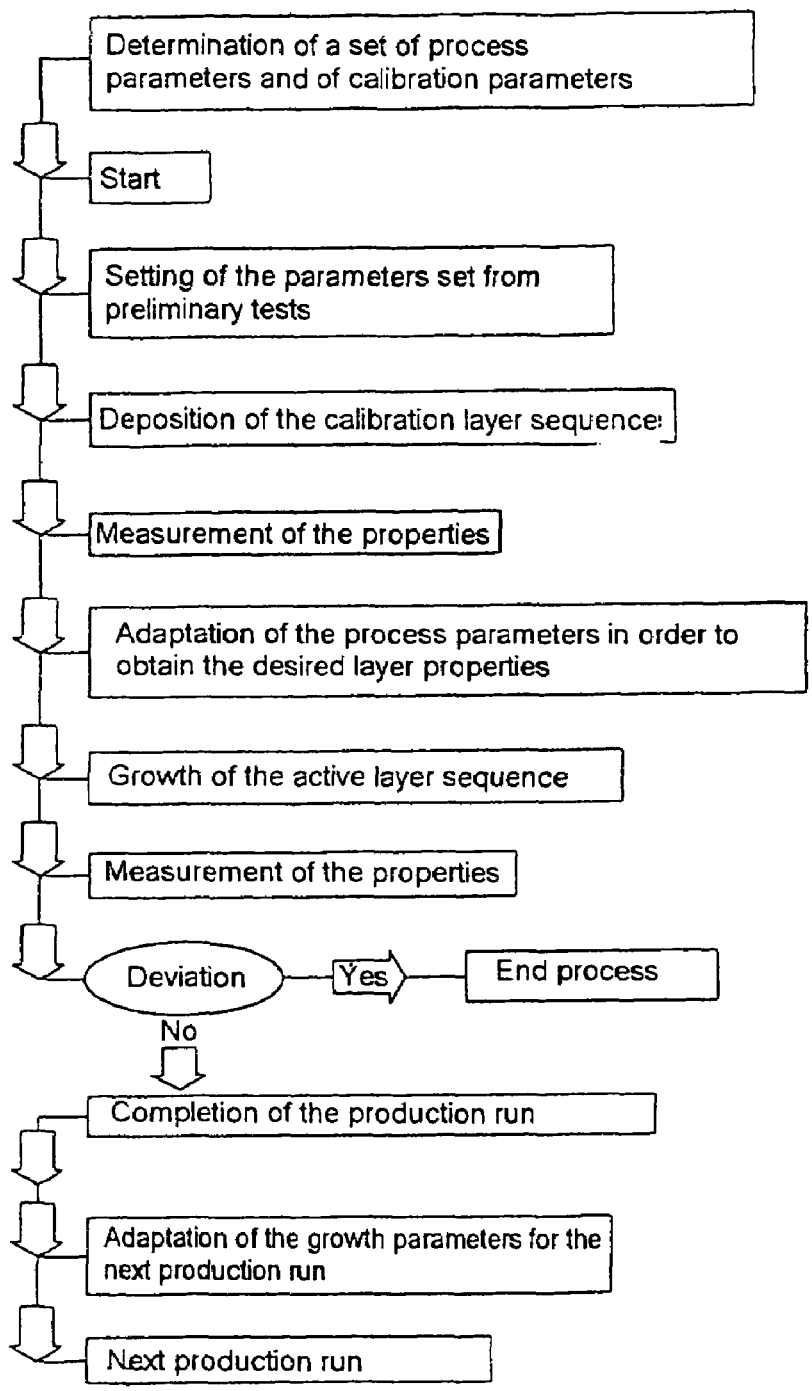
FIG. 2 shows the flow diagram of the process sequence.

The process follows the steps illustrated in FIG. 2, with the actual production run beginning at the "start" point.

FIG. 3 shows the layer structure. First of all, a buffer layer 14 is deposited on the substrate (not shown). Then, calibration layers 15, 16 are deposited on this buffer layer 14. This is followed by the deposition of a further buffer layer 17, on which the active layer 18 is then deposited. A covering layer 19 is deposited on the active layer 18, which may also be a layer sequence.

The method control may preferably be set in such a way that, in the event of the desired layer properties not being achieved during growth of the active layer, the process run is interrupted. Before the process run is terminated, a closure layer is deposited on the active layer which has already been commenced, so that the substrate can be reused.

If deviations from the instantaneously required growth parameters are detected during deposition of the calibration layers, it is possible to adapt the growth parameters in accordance with a known system of laws. In detail:

A deviation in the growth rate can be adjusted by realigning the partial pressure of elements of group III. This in turn can be effected by changing the quantity of carrier gas by means of the source by diluting the gas stream or by means of the pressure in the source or by means of the temperature of the bath of the source.

A deviation in the substrate temperature can be adjusted by controlling the heating power or the substrate rotational speed.

A deviation in the composition can be adjusted by tracking partial pressures of the reactants or by tracking the growth temperature on the substrate.

The partial pressures are preferably adjusted by altering the mass flow in the associated mass flow controller.

The deviations can also be counteracted by the introduction of additional monolayers or by varying the breaks in growth between deposition of individual sublayers or structures or by varying the process parameters during the breaks in growth.

The process parameters, as a group of values, in mathematical terms form a vector or a matrix. The same is also true of the varied process parameters. The layer properties and deviations associated with the respective process parameter sets and varied process parameter sets also form a group of values which in mathematical terms can be represented as a vector or a matrix. The two vectors or matrices can be mapped onto one another using functional relationships. The set of mapping functions which maps the process parameters onto the layer properties is determined during the preliminary tests. Depending on the number of parameter variations, these may be linear functions or higher-order functions. By forming the inverse functions or set of inverse functions associated with this set of functions, it is possible to numerically determine the calibration parameters, which in the simplest case can be represented mathematically by constants, vectors or matrices.

All features disclosed are (inherently) pertinent to the invention. The content of disclosure of the associated/appended priority documents (copy of the prior application) is hereby incorporated in its entirety in the disclosure of the application, partly with a view to incorporating features of these documents in claims of the present application.

What is claimed is:

1. A method for depositing crystalline active layers on at least one crystalline substrate from gaseous starting substances, which are introduced, together with a carrier gas, into the process chamber of a reactor, where, depending on process parameters determined in preliminary tests selected from the group consisting of substrate temperature, process chamber pressure, mass flow of the starting substances introduced into the process chamber, total mass flow, and combinations thereof, after prior pyrolytic decomposition, the starting substances are deposited on the substrate and form an active layer having properties selected from the group consisting of stoichiometry, doping, morphology, temperature, growth rate, and combinations thereof determined from surface measurements or measured without contact by sensors acting in the process chamber, characterized in that, in addition to the set of process parameters which contain the process parameters which lead to the desired layer properties, calibration parameters are also determined in the preliminary tests, by the deviations in the layer properties when individual process parameters are varied being determined and the corresponding deviation being placed into a relationship with the process parameter variation, and by, in the production run, prior to the deposition of the active layer, at least one calibration layer, the layer properties of which are measured or determined, being deposited in the same production run, deviation values being formed by placing these properties in a relationship to the desired layer properties, and by one or more process parameters being altered in accordance with the calibration parameters for deposition of the active layer as a function of the magnitude of the deviation values, wherein the method is an MOCVD method.

2. The method according to claim 1, wherein the process parameters further comprise source temperature of liquid MOCVD sources.

3. The method according to claim 1, characterized in that the mass flows are measured and controlled using mass flow controllers.

4. The method according to claim 1, characterized in that the starting substances also comprise one or more dopants, and the dopant concentration is also determined as a layer property.

5. The method according to claim 1, characterized in that the stress in the layer is also determined as a layer property.

6. The method according to claim 1, characterized in that the sensor is a reflection anisotropy spectroscope (RAS) or an ellipsometer.

7. The method according to claim 1, characterized in that the sensor for the temperature measurement is a thermocouple or an optical sensor.

8. The method according to claim 1, characterized in that the in situ measurement is carried out using X-ray diffraction, electron diffraction (REED) or IR reflectometry.

9. The method according to claim 1, characterized in that the calibration layers comprise a multilayer structure.

10. The method according to claim 1, characterized in that the layers in the calibration layer sequence have different energy gaps.

11. The method according to claim 1, characterized in that the caliberation layers have different growth rates.

12. The method according to claim 1, characterized in that the production run, in the event of the desired layer properties not being maintained, is interrupted and/or deposits a covering layer on the layer.

13. The method according to claim 1, wherein the sensor for the temperature measurement is a pyrometer.

* * * * *